（12）United States Patent
Matsukawa et al.

(10) Patent No.: US 7,589,335 B2
(45) Date of Patent: Sep. 15, 2009

(54) CHARGED-PARTICLE BEAM PATTERN WRITING METHOD AND APPARATUS AND SOFTWARE PROGRAM FOR USE THEREIN

(75) Inventors: Takuya Matsukawa, Shizuoka (JP); Shuichiro Fukutome, Shizuoka (JP); Tomoyuki Horiuchi, Shizuoka (JP); Hayato Kimura, Shizuoka (JP); Tateki Watanabe, Shizuoka (JP); Kiyoshi Hattori, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 314 days.

(21) Appl. No.: 11/772,414

(22) Filed: Jul. 2, 2007

(65) Prior Publication Data

US 2008/0011965 A1    Jan. 17, 2008

(30) Foreign Application Priority Data

Jul. 14, 2006   (JP)   ............................. 2006-194570

(51) Int. Cl.
*H01J 37/302* (2006.01)
*H01L 21/027* (2006.01)

(52) U.S. Cl. .............................. 250/492.22; 250/491.1

(58) Field of Classification Search ........................ None
See application file for complete search history.

(56) References Cited

U.S. PATENT DOCUMENTS

| 7,342,241 B2* | 3/2008 | Aoki et al. ............ 250/492.22 |
| 2003/0071231 A1* | 4/2003 | Haraguchi et al. ...... 250/492.22 |
| 2007/0023689 A1* | 2/2007 | Iizuka et al. ............ 250/491.1 |

FOREIGN PATENT DOCUMENTS

| JP | 7-211612 | 8/1995 |
| JP | 2005-235603 | 9/2005 |

* cited by examiner

*Primary Examiner*—Jack I Berman
(74) *Attorney, Agent, or Firm*—Oblon, Spivak, McClelland, Maier & Neustadt, P.C.

(57) ABSTRACT

A charged particle beam pattern writing apparatus in accordance with one preferred form of this invention includes an atmospheric pressure measuring unit which measures the value of an atmosphere air pressure, a coordinate value corrector which corrects three-dimensional (3D) coordinate values by use of the value of the air pressure measured, a deflection amount computing unit which calculates the deflection amount of a charged particle beam by using the 3D coordinate values corrected, an irradiator for irradiation of the charged particle beam, and a deflector for deflection of the charged particle beam based on the deflection amount.

14 Claims, 13 Drawing Sheets

CHARGED-PARTICLE BEAM PATTERN WRITING METHOD AND APPARATUS AND SOFTWARE PROGRAM FOR USE THEREIN

CROSS-REFERENCE TO RELATED APPLICATION

This application is based upon and claims the benefit of priority from prior Japanese Patent Application No. 2006-194570 filed on Jul. 14, 2006, the entire contents of which are incorporated herein by reference.

BACKGROUND OF THE INVENTION

1. Field of the Invention

The present invention relates generally to charged-particle beam lithography technologies and, more particularly, to a method and apparatus for writing a pattern on a workpiece by use of an electron beam while performing correction of a deflection position of the beam on a real-time basis.

2. Description of Related Art

Lithography techniques indispensable for growing miniaturization of semiconductor devices are to produce patterns unlike other semiconductor fabrication processes and, for this reason, are very important processes. In recent years, as LSI chips further increase in integration density, circuit line widths required for semiconductor devices are becoming smaller year by year. To form a desired circuit pattern on these semiconductor devices, it becomes necessary to use a high-accuracy original image pattern (also called the reticle or photomask). Note here that electron beam (EB) lithography techniques offer inherently excellent image resolutions and are used for production of such high-precision original pattern.

FIG. 13 shows schematically a perspective view of an electron beam optics in prior known variable-shaped electron beam (EB) lithographic apparatus.

As shown herein, the EB lithography tool includes a first aperture 410 having a rectangular opening or hole 411 for shaping an electron beam 330. The EB tool also includes a second aperture 420 having a variable shaping hole 421 for reshaping the electron beam 330 that passed through the hole 411 into a desired rectangular cross-sectional shape. The electron beam 330 that was emitted from a charged particle source 430 and then passed through the hole 411 is deflected by a deflector to penetrate part of the variable shaping hole 421 to thereby fall onto a workpiece 340, which is situated on a stage structure that is continuously movable in a prespecified one direction (e.g., X direction). In brief, only a beam with its rectangular shape capable of penetrating both the hole 411 and the variable shaping hole 421 is permitted to reach a pattern write area of the workpiece as mounted on the stage that continuously moves in the X direction, followed by pattern writing thereon. The scheme for creating any given shape by guiding the beam to pass through the holes 411 and 421 is called the variable-shaped beam (VSB) lithography.

Note here that in the EB lithographic tool, its pattern writing chamber can vary in shape with a change in atmospheric air pressure. This deformation affects a relative distance between an electron lens barrel overlying the writing chamber and the surface of a workpiece such as a photomask disposed within the chamber. If the relative distance is kept out of alignment due to a change in atmospheric pressure, appreciable aberration can occur in position of a pattern to be written and also in focus point of an electron beam, resulting in the lack of an ability to perform highly accurate pattern writing. In particular, while extra-high accuracy is required with growth in miniaturization of on-chip circuit linewidths in recent years, the risk of a decrease in pattern writing accuracy becomes no longer negligible, which is occurrable due to such atmospheric pressure variation-caused relative-distance/focus-point deviations.

A technique adapted for use in ultraviolet (UV) exposure apparatus for exposing a mask image onto wafers is disclosed, for example, in JP-A-7-211612, although it is not specifically directed to EB lithography. This Japanese patent bulletin involves the teaching as to an approach to obtaining the amount of curvature or "warp" of an image plane due to a change in atmospheric air pressure and then driving a stage to move to an optimal position in Z-axis direction.

As previously stated, while higher accuracy is required with further miniaturization of onchip circuit linewidth in recent years, the risk of a decrease in pattern writing accuracy becomes no longer negligible, which is occurrable due to the atmospheric pressure change-caused relative-distance/focus-point deviations. Additionally, a pattern writing position on the workpiece surface is defined two-dimensionally in x- and y-axis directions. Usually the electron beam's deflection position also is corrected two-dimensionally in the x and y directions. However, relative displacements due to atmospheric pressure variation take place three-dimensionally in x, y and z directions, respectively. Thus, it is required to achieve a three-dimensional (3D) correction scheme with handleability of these phenomena. Unfortunately, a technique for correcting deflection position deviations occurring due to atmospheric pressure variations has not yet been established in the prior art.

BRIEF SUMMARY OF THE INVENTION

It is therefore an object of this invention to provide a charged-particle beam pattern writing method and apparatus capable of correcting deviations of a pattern writing position and beam focus position occurring due to a change in atmospheric air pressure.

In accordance with one aspect of this invention, a charged particle beam pattern writing apparatus includes an air pressure measuring unit operative to measure a value of an outside air pressure, a coordinate value correcting unit operative to correct a set of three-dimensional ("3D") coordinate values by use of the value of the outside air pressure measured, a deflection amount computing unit operative to calculate a deflection amount of a charged particle beam by using the 3D coordinate values corrected, an irradiator unit for irradiation of the charged particle beam, and a deflector unit for deflection of the charged particle beam based on the deflection amount.

In accordance with another aspect of the invention, a charged particle beam writing method includes the steps of measuring a value of an atmospheric air pressure, correcting 3D coordinate values by use of the atmospheric air pressure value measured, computing a deflection amount of a charged particle beam by using the 3D coordinate values corrected, and irradiating the charged particle beam as deflected based on the deflection amount to thereby write a desired pattern on a workpiece.

In accordance with a further aspect of the invention, a computer-readable recording medium is provided which stores therein a software program for causing a logic operation device to perform a procedure including the steps of reading, from a storage device storing therein a first coordinate correction value and a second coordinate correction value plus a third coordinate correction value for correction of first, second and third coordinate values based on a value of an atmospheric air pressure, the first, second and third coordinate correction values to thereby use the first, second and third coordinate correction values thus read to correct the first to third coordinate values for storage in a storage device, reading from the storage device the third coordinate value for using this value to perform conversion of one or more coefficients of a prespecified formula for calculation of a deflection amount of a charged particle beam, and using the first and second coordinate values and the coefficients of the formula to determine the deflection amount of the charged particle beam and then outputting a result thereof.

DETAILED DESCRIPTION OF THE INVENTION

Embodiment 1

In embodiments below, an arrangement will be set forth which uses an electron beam as one example of the charged particle beam. The charged particle beam is not limited to only the electron beam and may alternatively be other similar energy beams, such as an ion beam or else. Additionally, an explanation will be given of a charged-particle beam pattern writing apparatus—particularly, a variable-shaped electron beam lithographic tool—as one example of the charged particle beam pattern writing apparatus as claimed.

Figure 1:
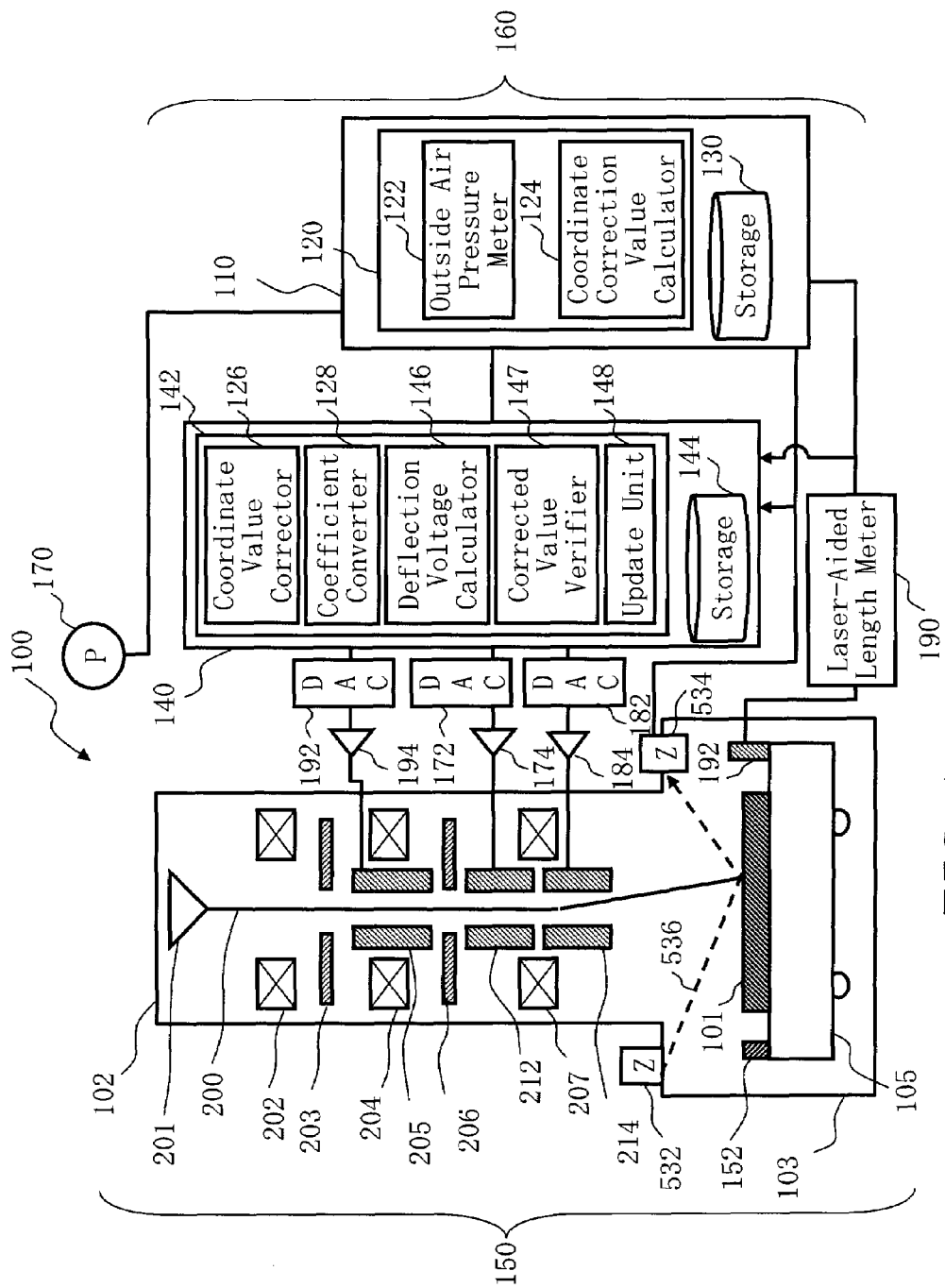
FIG. 1 is a diagram showing an overall configuration of a pattern writing apparatus in accordance with one embodiment of this invention.

FIG. 1 is a diagram showing an overall configuration of a pattern writing apparatus in accordance with one embodiment of this invention.

As shown in FIG. 1, the pattern writing apparatus 100 is generally made up of a pattern writing unit 150 and a control unit 160. The pattern writing apparatus 100 is one example of that is one example of the electron beam apparatus or "the electron beam lithographic apparatus". The writing apparatus 100 writes or "draws" an integrated circuit pattern on a workpiece 101. A typical example of the workpiece 101 is a photomask for use in the manufacture of semiconductor devices, such as LSI chips. The pattern writing unit 150 includes a writing chamber 103 and an electron lens barrel 102 disposed above the chamber 103. Provided in the electron lens barrel 102 are an electron gun 201, illumination lens 202, first aperture 203, projection lens 204, deflector 205, second aperture 206, objective lens 207, sub-deflector 212, and main deflector 214. An XY stage 105 is disposed within the pattern writing chamber 103. On this XY stage 105, a workpiece 101 is mounted, which is a pattern writing object. A mirror 192 is situated on the XY stage 105. A z-axis position sensor module is disposed on the upper surface side of the writing chamber 103, which sensor has a light projector 532 and a photodetector 534 for detection of a position or "height" in z-axis direction of the workpiece 101—i.e., the direction at right angles to the workpiece 101's x-y plane defining its pattern writing surface. The light projector 532 may illustratively be a light irradiator, such as a light-emitting diode (LED). The photodetector 534 is preferably a position sensitive device (PSD).

The control unit 160 includes a pattern writing control circuit 110, a deflection control circuit 140, an air pressure-measuring device, i.e., barometer 170 for measuring an atmospheric pressure in the installation environment of electron lens barrel 102, a digital-to-analog converter (DAC) 172, an amplifier 174, a DAC 182, an amp 184, a DAC 192, an amp 194, and a laser-assisted length-measuring device 190. The pattern write control circuit 110 has a control computer with its central processing unit (CPU) 120, and a data storage or memory device 130. The deflection control circuit 140 has a control computer (CPU) 142, and storage device 144. The control circuit 110 is connected to the barometer 170, deflection control circuit 140, photodetector 534 and laser length meter 190 via a bus or buses (not shown). The laser length meter 190 is connected at its output to the deflection control circuit 140 via a bus (not shown). The deflection control circuit 140 generates an output signal (DAC value) for sub-deflection use, which signal is converted into an analog signal by DAC 172 and amplified by amp 174 for output to the sub-deflector 212. This output value's voltage potential is used to deflect an electron beam 200 within a subdeflection plane. An output signal (DAC value) for main deflection use which is generated from the deflection control circuit 140 is analog-converted by DAC 182 and amplified by amp 184 for output to the main deflector 214. Using this output value's voltage potential, let the electron beam 200 deflect in a main deflection plane. An output signal (DAC value) from the deflection control circuit 140 for shaping/deflection use is analog-converted by DAC 192 and amplified by amp 194 for output to the deflector 205. By this output value's voltage potential, the electron beam 200 is shaped and deflected. The CPU 120 has respective internal functional modules, such as an outside air pressure measuring unit 122 and a coordinate correction value computing unit 124. Any one of information to be input to CPU 120 and information in the process of computation processing and after completion of processing is stored in the storage device 130 in an event-sensitive manner. The other CPU 142 has respective internal function modules, such as a coordinate value correction unit 126, a coefficient conversion unit 128, a deflection voltage computing unit 146, a corrected value verify unit 147 and an update unit 148. Any one of information being input to CPU 142 and information being presently processed and having already been processed is stored in the storage device 144 in an event-sensitive way.

Although in FIG. 1 several constituent elements other than those necessary for explanation of Embodiment 1 are eliminated in illustration, it readily occurs to a person skilled in the art that the pattern writing apparatus 100 is usually arranged to include other necessary configurations.

Also note that although in FIG. 1 the CPU 120 that is one example of the computer is arranged to execute the processing of respective functions of the outside air pressure measuring unit 122 and coordinate correction value computing unit 124, this design is not an exclusive one and may alternatively be modified so that these functions are implemented by hardware configurations using electrical or electronic circuitry. Alternatively, the same is arrangeable by using combinations of electric/electronic circuit-based hardware and software programs. Still alternatively, similar results are obtainable by any possible combinations of hardware and firmware configurations. Similarly, although the CPU 142 that is one example of the computer is arranged to execute the processing of respective functions of the coordinate value correction unit 126, coefficient converter unit 128, deflection voltage computing unit 146, corrected value verify unit 147 and update unit 148, this design is not exclusive and may alternatively be modified so that these functions are implemented by hardware configurations by means of electrical or electronic circuitry. Alternatively, the same is arrangeable by using combinations of electric/electronic circuit-based hardware and software programs. Still alternatively, similar results are obtainable by possible combinations of hardware and firmware configurations.

The electron beam 200 which was emitted from the electron gun 201 that is one example of the irradiation unit is guided by the illumination lens 202 to illuminate an entire surface area of the first aperture 203 having a rectangular opening or hole. At here, the electron beam 200 is shaped to have a rectangular shape in cross-section. Then, the electron beam 200 of a first aperture image which passed through the first aperture 203 is projected onto the second aperture 206 by the projection lens 204. A position of the first aperture image on the second aperture 206 is controlled by the deflector 205 to enable the beam to change in shape and size. Then, the electron beam 200 of a second aperture image which passed through the second aperture 206 is subjected to focussing by the objective lens 207 and deflected by the sub-deflector 212 and main deflector 214, which make up the deflector unit as claimed, to fall onto the workpiece 105 on the movably disposed XY state 105 at a desired position on the workpiece surface. Positions in x and y directions in parallel with the workpiece surface (pattern writing plane) of XY stage 105 are detected and measured in a way such that the laser length meter 109 is activated to emit laser light, which reaches the mirror 192 and is reflected therefrom, resulting in production of reflected light which is received and sensed by the photodetector 534 for length/distance measurement. Although in FIG. 1 only a one pair of mirror 192 and laser length meter 190 is illustrated, the reality is that more than two pairs are laid out to enable length measurement of coordinate positions in the x direction and y direction.

Figure 2:
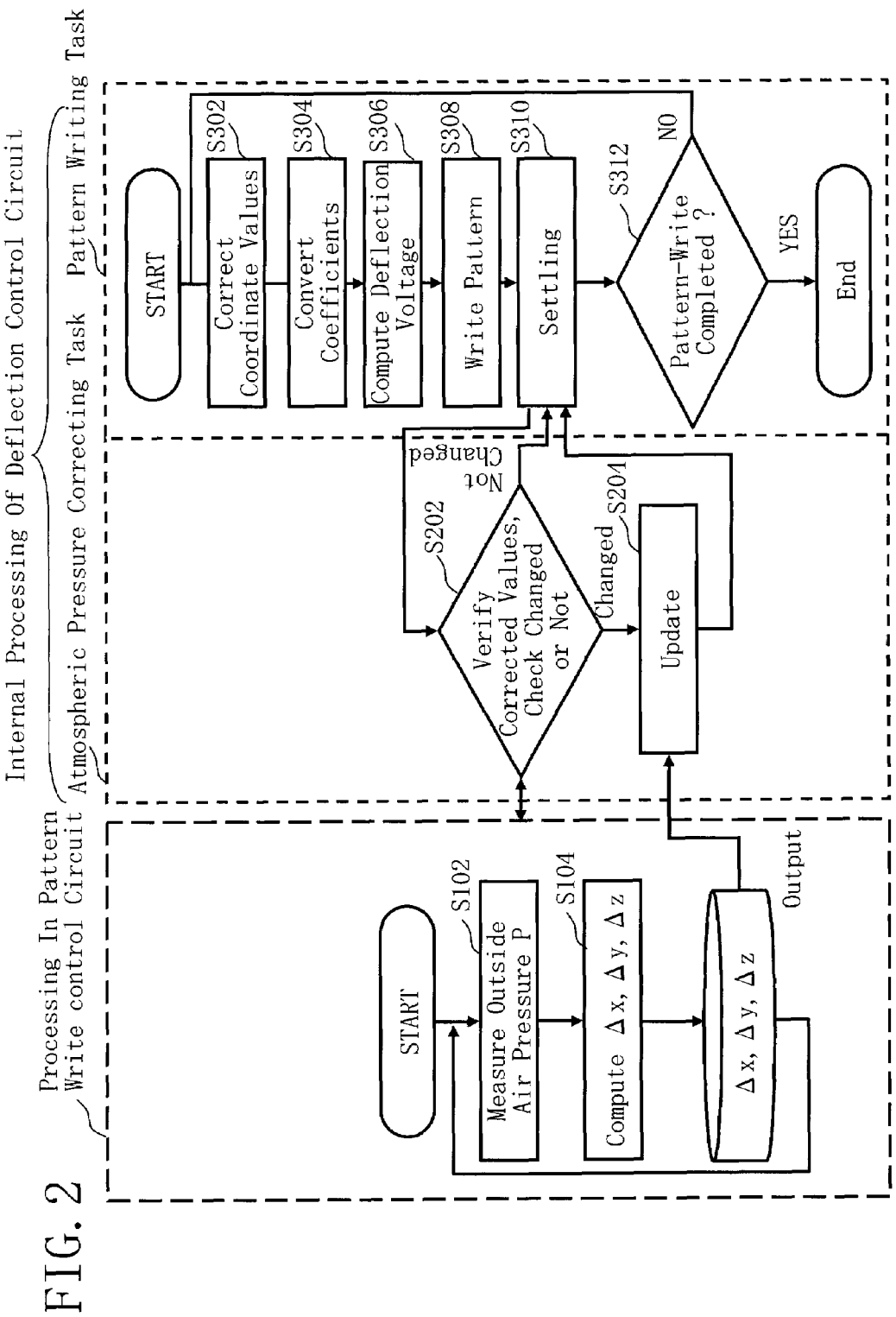
FIG. 2 is a diagram showing major process steps of an electron beam pattern writing apparatus also embodying the invention.

FIG. 2 is a diagram showing major process steps of an electron beam writing method also embodying the invention.

FIG. 2 shows processing procedures to be internally executed in the pattern writing control circuit 110 and the deflection control circuit 140, which are necessary for correction of a pattern write position deviable due to atmospheric pressure variations. As the internal processing of the pattern writing control circuit 110, a series of processes are performed, including an outside air pressure measurement step S102 and a coordinate correction value calculation step S104.

The internal processing of the deflection control circuit 140 employs what is called the "dual task" scheme, which permits two different tasks—e.g., a barometric pressure correcting task and a pattern writing task—to get started simultaneously. The pattern writing task includes a series of steps, i.e., a coordinate value correction step S302, coefficient conversion step S304, deflection voltage computing step S306, pattern writing step S308, settling step S310, and decision step S312. The air pressure correcting task includes in succession a corrected value verify step S202 and update step S204.

Figure 3:
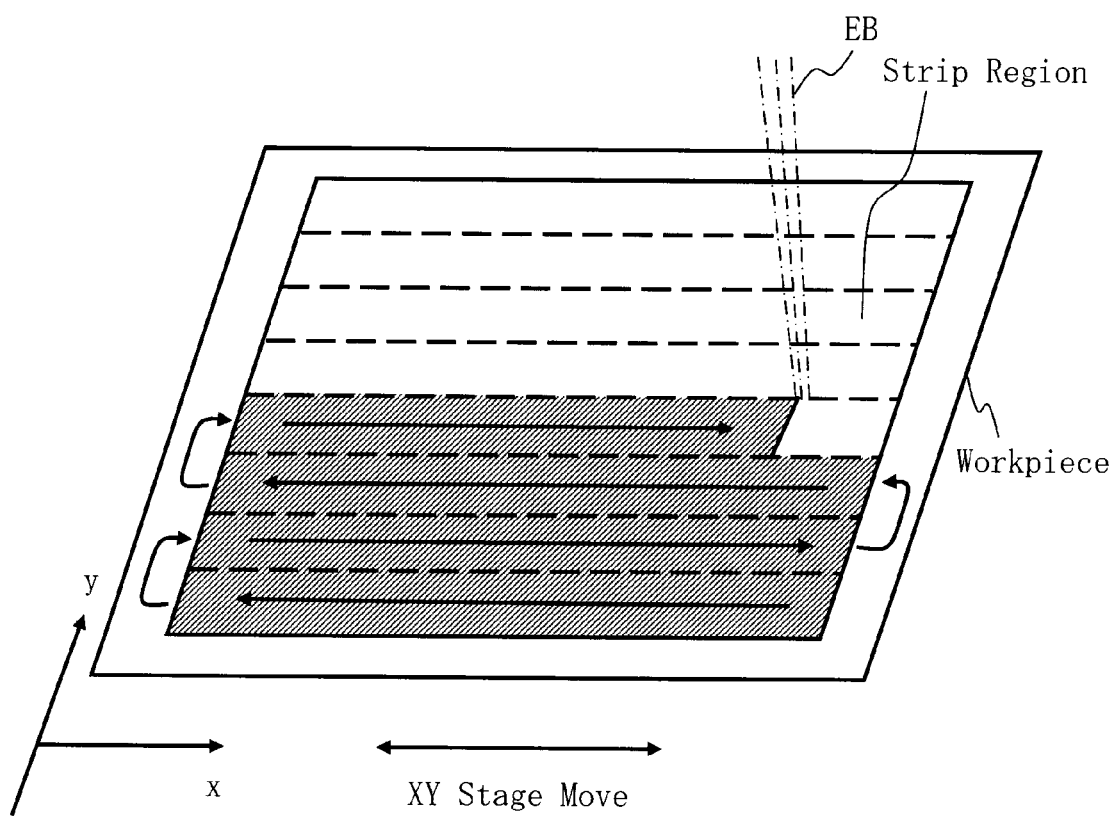
FIG. 3 is a diagram showing a perspective view of a workpiece which is mounted on a movable XY stage structure.

FIG. 3 is a diagram showing a perspective view of workpiece 101 mounted on the movable XY stage 105.

When writing a circuit pattern on the workpiece 101, the XY stage 105 is driven by a driver unit (not shown) to continuously move in the x direction. Simultaneously, the electron beam 200 emitted is guided to fall onto the workpiece 101 to scan one of a plurality of beam-deflectable long and narrow strip-like regions which are virtually divided from a pattern writing area of workpiece 101. While the XY stage 105 moves along the x direction, a present shot position of the electron beam 200 is controlled to perform tracking of such stage motion. Letting it move continuously makes it possible to shorten a total length of time as taken to write the pattern. After having written one strip region, the XY stage 105 is forced to perform step shifting in the y direction and then move in the x direction (this time, in the reverse direction) for execution of pattern writing of the next strip region. By progressing respective strip regions' pattern writing operations in a serpentine manner, it is possible to shorten the total moving time of the XY stage 105.

Note here that when performing such electron-beam pattern writing, a need is felt to perform in advance the measurement (calibration) of the electron beam optics. This measurement (calibration) is performed for an entirety of the electron beam optics inside of the pattern writing unit 150 shown in FIG. 1. With the measurement and adjustment, one or more correction coefficients are calculated, which are needed for beam deflection sensitivity adjustment and beam deflection. These measurement and adjustment are regarded as a beam adjustment process, which is performed in a way separate from the pattern writing process, as prearrangement of the writing process of writing a desired pattern(s) on the workpiece.

By the beam adjustment process, the deflection sensitivity of a deflector, e.g., main deflector 214, is measured (calibrated). A digital-to-analog converted (DAC) value to be corrected by such correction is defined by using an X value and a Y value which become DAC value data, wherein the DAC value is output, for example, to DAC 182 which determines a voltage value that is set in the main deflector 214. As an example, these X and Y values are obtainable by Equations (1) and (2) below. Here, these equations are called the beam deflection sensitivity correction functions.

$$X = a_0 + (a_1 + 1)x + a_2 y + a_3 x \cdot y + a_4 \cdot x^2 + \quad (1)$$
$$a_5 \cdot y^2 + a_6 \cdot x^3 + a_7 x^2 \cdot y + a_8 \cdot x \cdot y^2 + a_9 \cdot y^3$$

$$Y = b_0 + b_1 \cdot x + (b_2 + 1) \cdot y + b_3 \cdot x \cdot y + \quad (2)$$
$$b_4 \cdot x^2 + b_5 \cdot y^2 + b_6 \cdot x^3 + b_7 \cdot x^2 \cdot y + b_8 \cdot x \cdot y^2 + b_9 \cdot y^3$$

To obtain these equations, what is needed to be done first is to determine through measurement an error between the original or "ideal" position designed and an actual position to be measured by the laser length meter 190.

Figure 4:
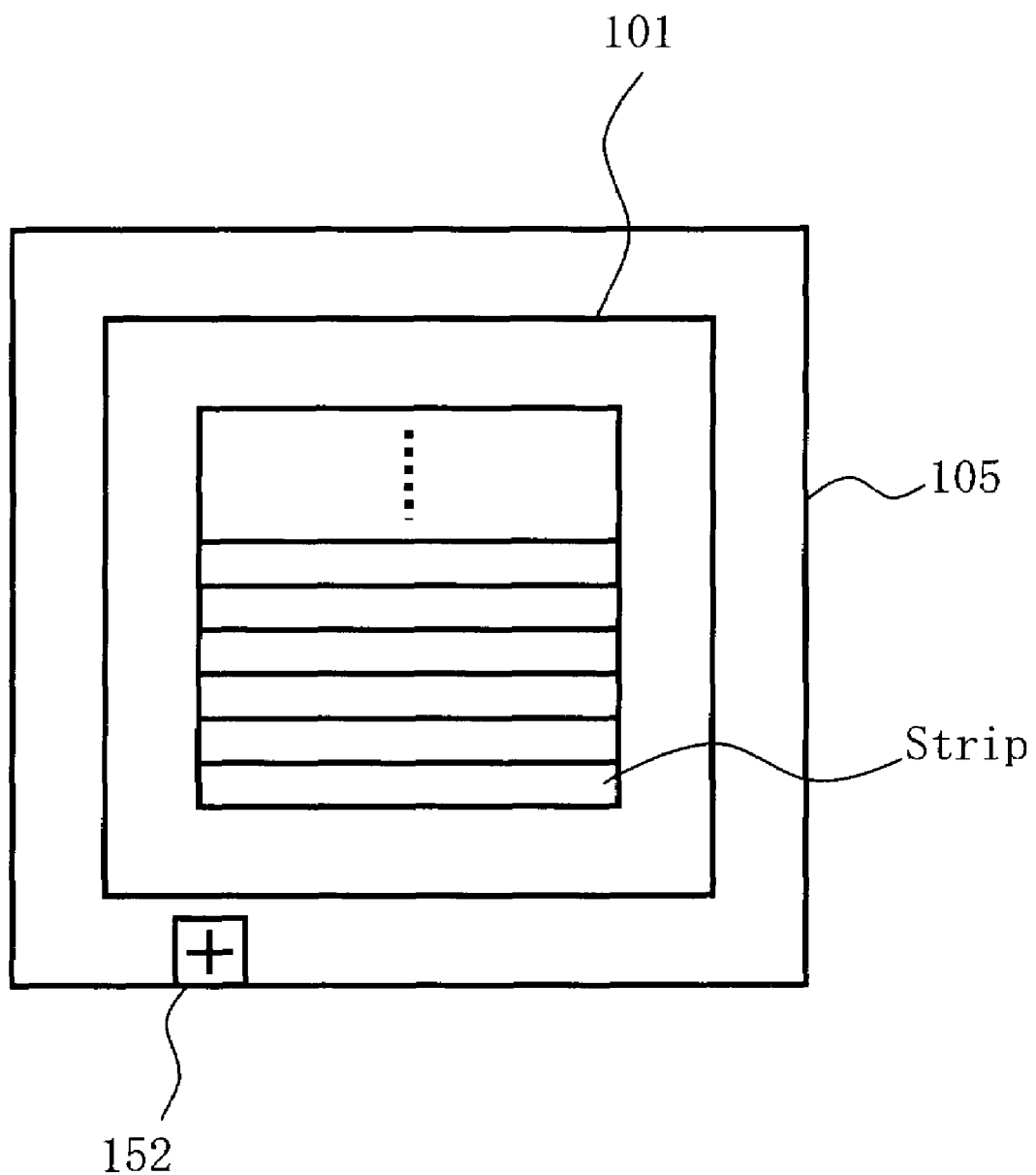
FIG. 4 is a plan view of the XY stage.

FIG. 4 is an upper plan view of the XY stage 150 for explanation of a mark position measurement process in the EB lithographic tool 100 shown in FIG. 1.

As shown in FIG. 4, a mark 152 for measurement of the deflection sensitivity of the electron beam 200 is provided on the XY stage 105 with the workpiece 101 mounted thereon. This mark's position coordinates are searchable by stage movement and electron beam deflection. Reflected electrons occurring upon irradiation of the electron beam 200 to mark 152 are measured, and a certain set of coordinates with the measurement value maximized is determined to be the coordinates of the mark position. This mark's position coordinates are calculated by use of the deflection of electron beam 200 so that an atmospheric pressure value-dependent variation or fluctuation can be seen therein. One or several correction coefficients for such atmospheric pressure variation are derivable from the relativity of this atmospheric pressure value and mark position coordinate deviation.

Here, an explanation will be given as to areas or regions for deflection of the main deflector 214 and sub-deflector 212.

Figure 5:
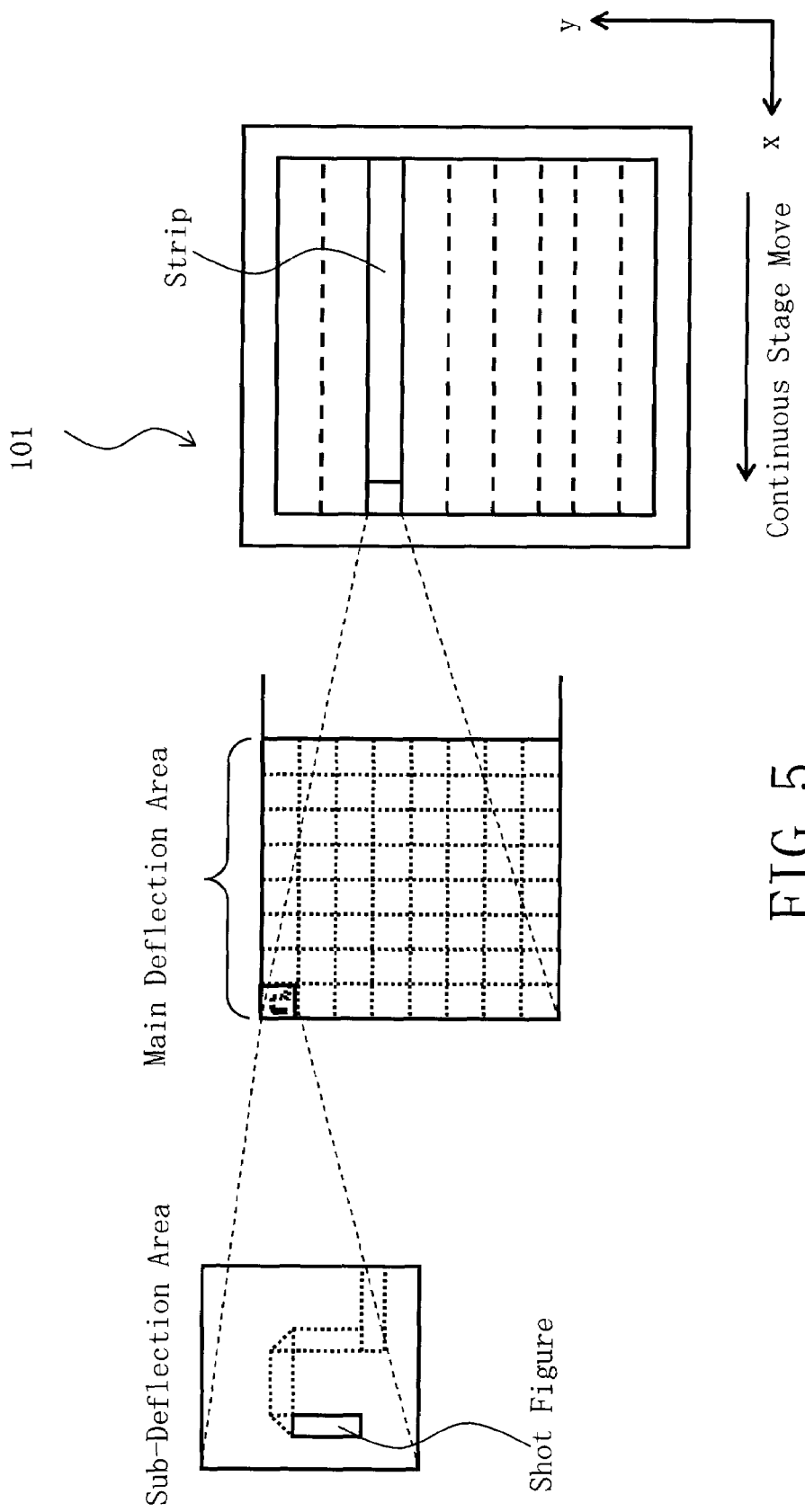
FIG. 5 is a pictorial representation of the workpiece having a main deflection area and sub deflection area.

FIG. 5 is a pictorial representation of the workpiece having its main deflection area and sub-deflection area.

As shown in FIG. 5, in the case of a specified circuit pattern being written or "drawn" in the EB lithography tool 100, the pattern write region of a photomask that is an example of the workpiece 101 is subdivided along the y direction into a plurality of strip-like unit regions for pattern writing, each of which regions has a width that is deflectable by the main deflector 214. In each strip, a region deflectable by the main deflector becomes a main deflection area. This main deflection area is further divided into fine regions, which become sub-deflection regions, also called the sub-fields.

The sub-deflector 212 is used to accurately control a per-shot position of the electron beam 200 at high speeds. To this end, a deflection range is limited to a sub-field as shown in FIG. 5. For pattern writing exceeding this region, the sub-field's position is moved or shifted by the main deflector 214. In view of the fact that this main deflector 214 is used to control the subfield position and that the XY stage 105 is continuously moving in the x direction during pattern writing, the subfield's origin for pattern writing is caused by the main deflector 214 to move (perform tracking) whenever the need arises, thereby causing it to follow the movement of the XY stage 105.

Figure 6:
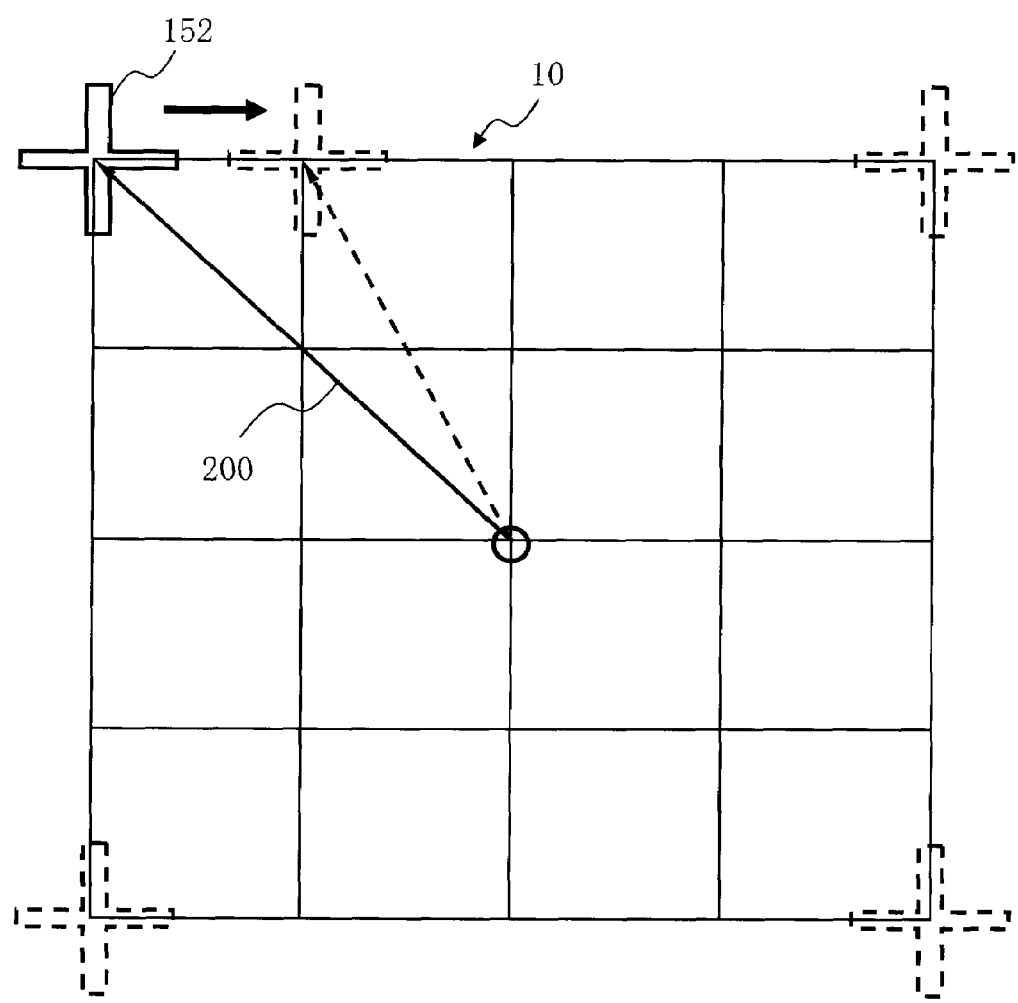
FIG. 6 is a diagram for explanation of a way of measuring a mark position in the embodiment.

FIG. 6 is a diagram for explanation of a way of measuring a mark position in the embodiment apparatus.

As shown in FIG. 6, the XY stage 105 is driven to move so that the mark 152 moves to each position within the main deflection region 10. Then, the electron beam 200 is deflected at each position in the main deflection region 10 to thereby measure the position of mark 152 and then obtain a residual difference thereof. Here, such operation is performed with respect to a total of twenty five (25) locations in the main deflection area 10—i.e., a matrix of five rows and five columns of points. Then, the residual difference obtained is subject to execution of the fitting by a third-order or tertiary function equation with the x and y of the above-stated Equations (1) and (2) being as variables thereof whereby it is possible to obtain respective coefficients $a_0$ to $a_9$ and $b_0$-$b_9$ of the x-y function equation.

Then, the deflection control circuit 140 inputs from the pattern writing control circuit 110 shot data (not shown) along with the position information and obtains an X value that becomes one of the DAC value data by Equation (1) while obtaining a Y value that is another one of the DAC value data by Equation (2). Next, the electron beam 200 is deflected by using an amplified value of a digital-to-analog converted version of a DAC value (deflection voltage) with the X value and Y value being as its parameters. For example, in the case of using an eight-pole electrostatic deflector having eight separate electrodes No. 1 to No. 8 which are laid out on the main deflector 214 in a clockwise direction when being looked at from its upper side, the DAC value setting may be performed in a way which follows. To deflect the beam in a predetermined direction of the x and y directions, a value Y is set to the electrode #1; a value $(X+Y)/2^{1/2}$ is set to electrode #2; X is set to electrode #3; $(X-Y)/2^{1/2}$ is set to electrode #4; $-Y$ is set to electrode #5; $(-X-Y)/2^{1/2}$ is set to electrode #6; $-X$ is set to electrode #7; and, $(-X+Y)/2^{1/2}$ is set to electrode #8. Then, a voltage with its potential equivalent to each amplified value of a digital-to-analog converted version of each DAC value thus set is applied to its corresponding one of the electrodes. Here, in light of the fact that the write beam can experience unwanted distortion and/or deviance of its focusing point in a way depending upon the workpiece 101's present position in the z direction, it is preferable to convert the coefficients of Equations (1) and (2) at a z-axis position that was detected by the z sensor. This coefficient conversion is definable by Equation (3) to be presented later.

FIG. 6 is a diagram for explanation of a process of calculating the coefficients in Equations (1) and (2). As shown in FIG. 6, the XY stage 105 is driven to move so that the mark 152 moves to each position within the main deflection region. Then, after having determined a mark that becomes the reference, the electron beam 200 is deflected to each position in the main deflection region to thereby measure the mark position and then obtain a residual difference between a moved degree of laser coordinates and a deflection distance. Here, this operation is performed with respect to a total of twenty fine (25) locations in the main deflection area—i.e., a matrix of five rows and five columns of points. Then, the residual difference obtained is subject to execution of the fitting by the tertiary function equation with the x and y of the above-stated Equations (1) and (2) being as its variables to thereby calculate respective coefficients $a_0$-$a_9$ and $b_0$-$b_9$ of the deflection sensitivity correction function (i.e., x-y function equation).

Figure 7:
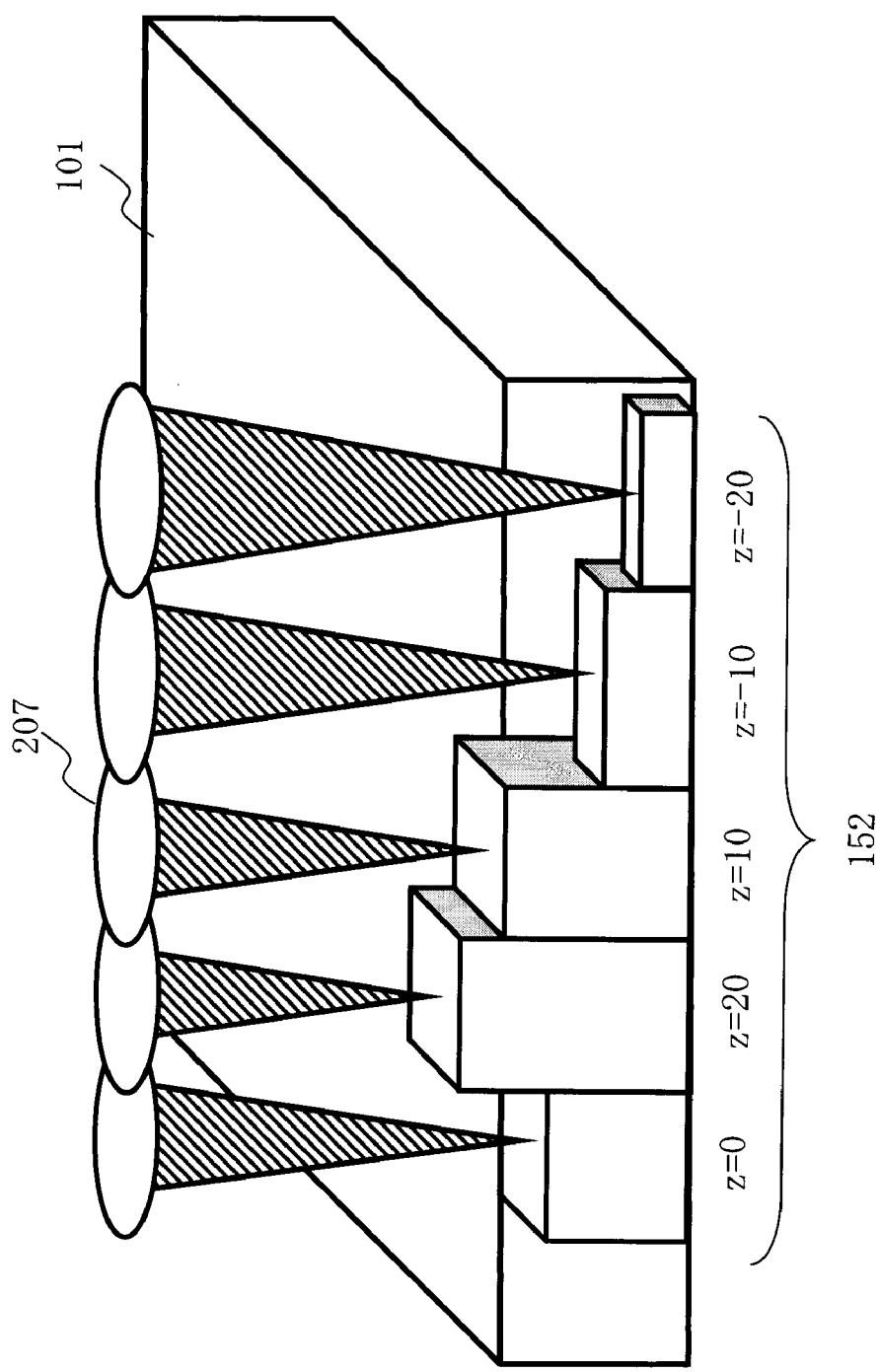
FIG. 7 is a diagram for explanation of a way of measuring the height of the mark in the embodiment.

FIG. 7 is a diagram for explanation of a way of measuring the height of the mark in the embodiment.

Figure 8:
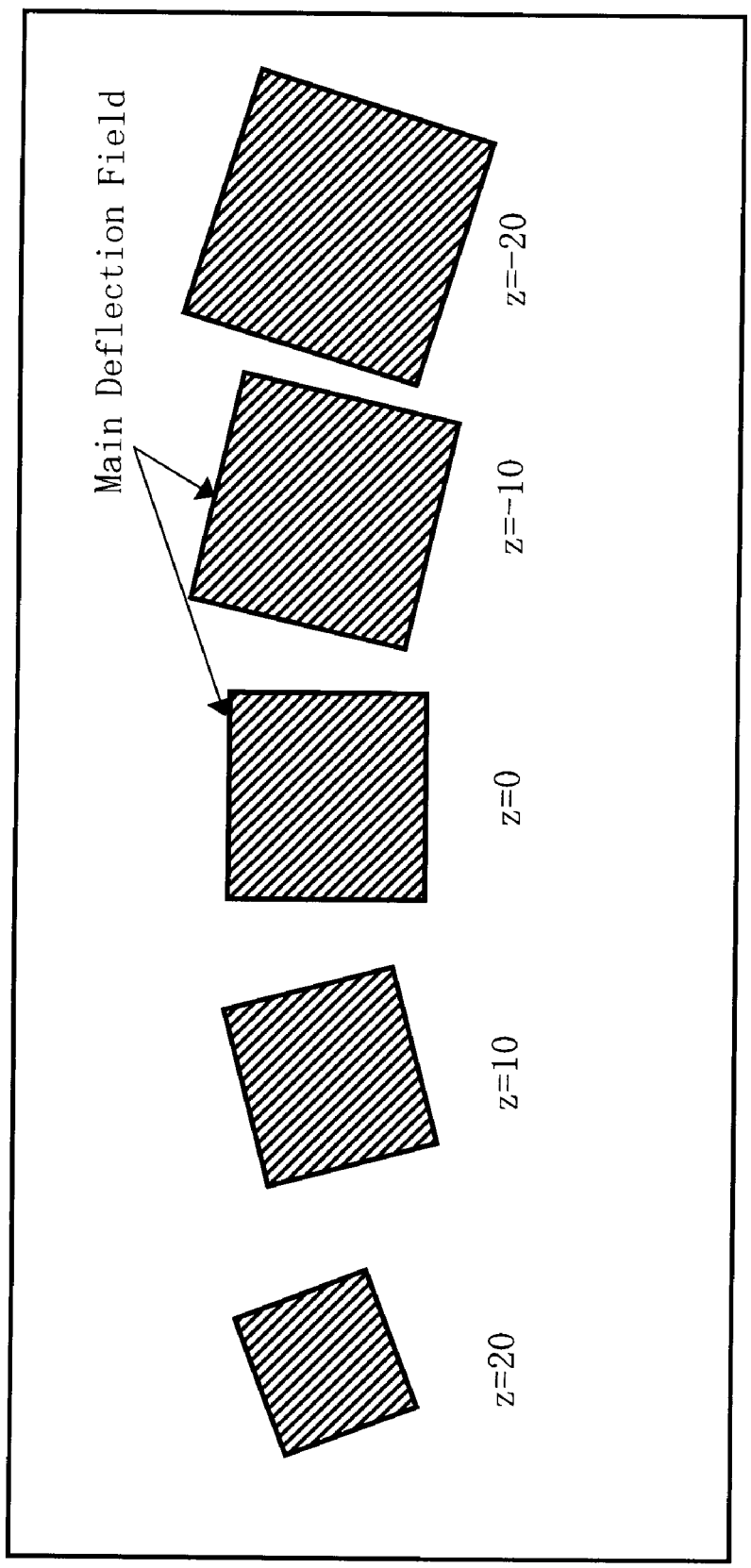
FIG. 8 is a diagram showing some occurrable errors in rotation and magnification of a focused electron beam depending upon the height of the workpiece.

FIG. 8 is a diagram showing rotation and magnification errors in out-of-focus of an electron beam depending upon the height of the workpiece surface in this embodiment.

Figure 9:
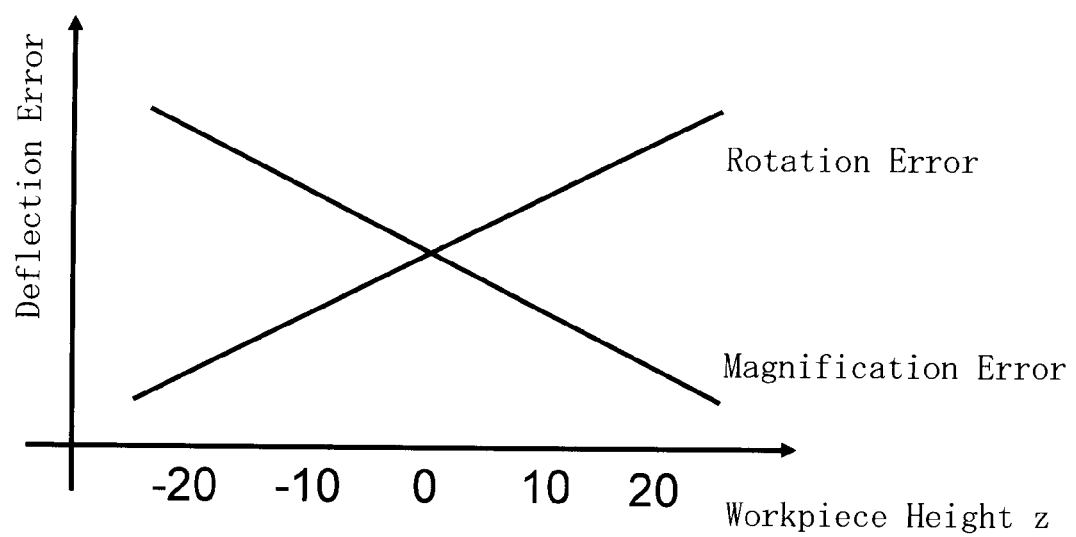
FIG. 9 is a graph showing rotation/magnification errors of a focused electron beam depending on the height of the workpiece.

FIG. 9 is a graph schematically showing rotation and magnification errors in out-of-focus of the electron beam depending on the height of the workpiece plane in the embodiment.

Using FIGS. 7-9, an explanation will be given of a way of creation of deviations of electron beam focus point and deflection sensitivity in accordance with the height of the workpiece surface to be processed. As shown in FIG. 7, in case the electron beam 200 is irradiated onto the mark 152 having height differences with a level of Z=0 being as a reference point, the electron beam 200 exhibits unwanted rotation and size change such as shrinkage or expansion of the deflection region as shown in FIG. 8. When the beam's focus point is deviated or offset, mismatching takes place among the deflection region's magnification component and rotation component as well as shift component. Accordingly, in the case of correction of the beam's focus point in accordance to the height of the workpiece surface, it becomes inevitable to perform the magnification correction and rotation correction plus shift correction of the deflection region. However, if the current center of a correction-use lens is adjusted properly, the shift correction is no longer required. Here, upon determination of a given height reference point, rotation and magnification errors from such reference point are each representable by a linear function of the height (Z) such as shown in FIG. 9. And, these magnification, rotation and shift corrections are achievable with sufficiently high accuracy by use of a linear expression such as indicated by Equation (3) below.

$$a_0=a_0+a_0\cdot z,\ a_1=a_1+a_1\cdot z,\ a_2=a_2+a_2\cdot z\ b_0=b_0+b_0\cdot z,\\ b_1=b_1 b_1\cdot z,\ b_2=b_2+b_2\cdot z \quad (3)$$

In this equation, $a_0$ and $b_0$ represent axis deviation correction, $a_1$ and $b_2$ indicate magnification correction, and $a_2$ and $b_1$ represent rotation correction, which are substituted into Equations (1) and (2), respectively. In addition, substituted into z in Equation (3) is a value that was measured by the z sensor prior to pattern writing. By dividing the workpiece surface into a matrix of mesh-like portions and then measuring the grid height of each mesh by the z sensor, it is possible to perform mapping of the height (z) in the workpiece surface. This makes it possible to obtain the z value of any given position. By putting this z value into Equation (3), it becomes possible to perform adequate beam focussing in a way pursuant to the height of the workpiece surface in the main deflection area.

In this way, by obtaining respective coefficients $a_0$-$a_2$ and $b_0$-$b_2$ from the relationship shown in FIG. 9, it is possible to achieve the intended correction of about-the-z-axis rotation, magnification and shift of the deflection region even in cases where focus-point correction is implemented in deference to a deviation in height of the workpiece surface.

Note here that the discussion above works out under an assumption that the outside air pressure is kept constant. If the atmospheric pressure varies, further errors occur inevitably.

Figure 10:
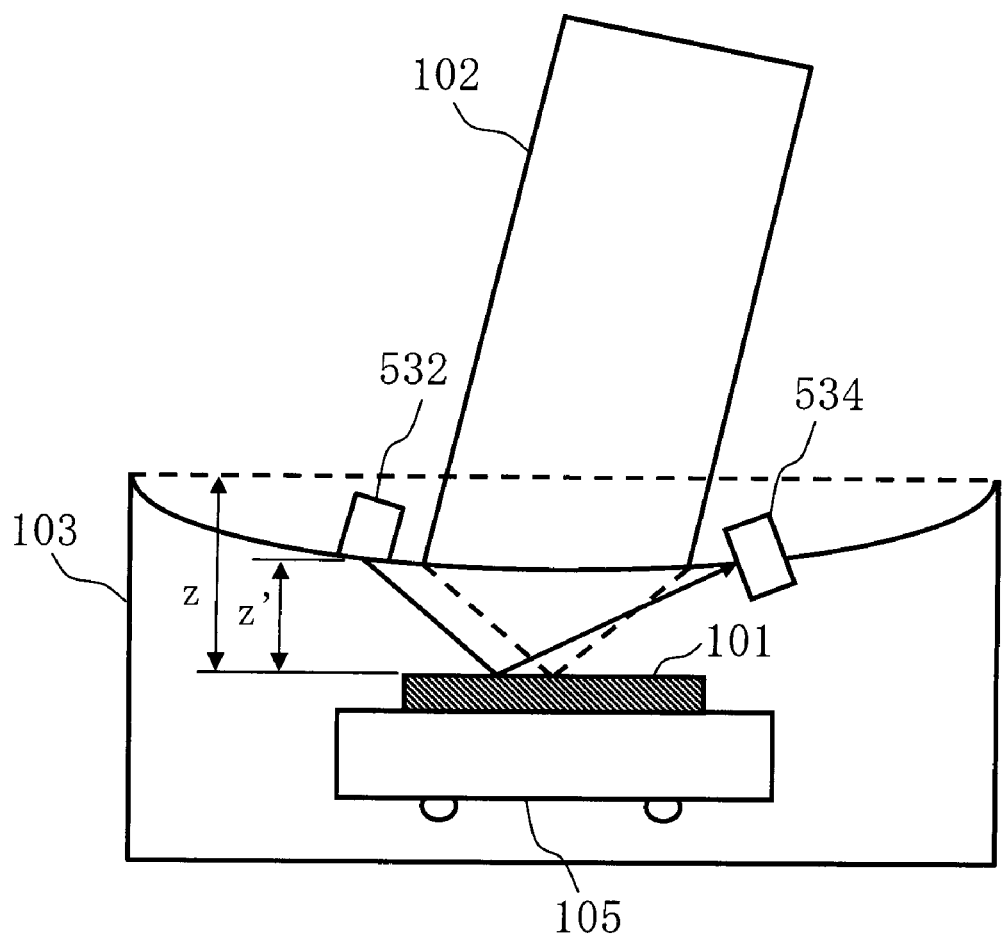
FIG. 10 is a diagram for explanation of a way of occurring distortion in the pattern writing apparatus of FIG. 1 when the ambient air pressure increases.

FIG. 10 is a diagram for explanation of an exemplary way of distortion occurring in the EB lithographic apparatus 100 when its ambient air pressure increases.

An example is that when the outside air pressure P rises up, a ceiling on the top plate side of the pattern writing chamber 103 with its interior space being evaluated by a vacuum pump (not shown) is pushed or "pressed" by the atmospheric pressure P and thus is deformed toward the inside of chamber 103. Such deformation is typically on the order of magnitude of nanometers (nm). In such case, the electron lens barrel 102 overlying the writing chamber 103 can deviate in its position, resulting in the relative position between the optics within barrel 102 and the surface of workpiece 101 being displaced three-dimensionally in x-, y- and z-axis directions, respectively. Regarding the z direction, for example, the value z is changed to a value z'. Additionally, an error can take place in the z sensor's measurement value per se. This can be said because the chamber ceiling's dishing results in the light projector 532 and its associated photosensor 534 being deviated in installation positions. To avoid this risk, this embodiment employs a process of amending such deviations as shown in the flow shown in FIG. 2.

At step S102, an outside air pressure is measured. To do this, the atmospheric pressure measurement unit 122 inputs from the barometer 170 a value of atmospheric air pressure P and measures a present atmospheric pressure.

At step S104 which is for calculation of coordinate correction values, the coordinate correction value computing unit 124 uses the measured value of atmospheric air pressure value P to calculate coordinate correction values $\Delta x$, $\Delta y$ and $\Delta z$ (first, second and third coordinate correction values) for correction of coordinate values (x,y,z) (first, second and third coordinate values) and then stores these values in the storage device 130. The coordinate values are defined by an x-coordinate value which indicates a position in first direction (x direction) in parallel with the pattern writing surface of workpiece 101, a y-coordinate value indicating a position in second direction (y direction) in parallel with the pattern writing surface and at right angles to the x direction, and a z-coordinate value indicative of a position (height) of the pattern writing surface in third direction (z direction) perpendicular to the pattern write surface. Then in this coordinate correction value calculation step, there are calculated as the coordinate correction values an x-coordinate correction value $\Delta x$ for correction of the x-coordinate value, a y-coordinate correction value $\Delta y$ for correction of the y-coordinate value, and a z-coordinate correction value $\Delta z$ for correction of the z-coordinate value.

Firstly, the x-coordinate correction value $\Delta x$ is obtainable by Equation (4) given below, by using a coefficient $c_1$ of proportionality in x-axis direction (its unit is typically nanometers per hectopascal or "nm/hPa") and an offset value $P_1$ of the atmospheric pressure P (e.g., unit is hPa).

$$\Delta x = c_1 \cdot (P-P_1) \quad (4)$$

The y-coordinate correction value $\Delta y$ is definable by Equation (5) below, by using a proportionality coefficient $c_2$ in y-direction (its unit is typically "nm/hPa") and the above-stated offset value $P_1$ of the atmospheric pressure P.

$$\Delta y = c_2 \cdot (P-P_1) \quad (5)$$

The z-coordinate correction value $\Delta z$ is definable by Equation (6) below, by using a proportionality coefficient $c_3$ in z-direction (its unit is "nm/hPa") and the above-stated offset value $P_1$ of the atmospheric pressure P.

$$\Delta z = c_3 \cdot (P-P_1) \quad (6)$$

The coordinate correction values $\Delta x$, $\Delta y$, $\Delta z$ obtained in the way stated above are temporarily stored in the storage device 130. This series of steps S102 to S104 will be repeated at a prespecified time interval to update the coordinate correction values $\Delta x$, $\Delta y$, $\Delta z$ to the latest values. The interval is set at a one minute, by way of example. Alternatively, it may be a shorter period. Alternatively it may be a longer period, although in this case the real-time property is somewhat degraded. Additionally the coordinate correction value calculation step is a process independent of the pattern writing step or the beam adjustment step and is out of sync therewith.

On the other hand, a pattern writing task gets started in the deflection control circuit 140. In this case the latest version of coordinate correction values $\Delta x$, $\Delta y$, $\Delta z$ are stored in the storage device 144 whenever the need arises in a way as will be described later.

At step S302, coordinate value correction is performed. More specifically, the coordinate value correction unit 126 reads the coordinate correction values $\Delta x$, $\Delta y$ and $\Delta z$ out of the storage device 144 and uses the coordinate correction values $\Delta x$, $\Delta y$, $\Delta z$ thus read to correct the set of coordinate values (x, y, z). Then, the coordinate value correction unit 126 computes a set of corrected coordinate values (x', y', z'). In the coordinate value correction step, the x-coordinate correction value $\Delta x$ is used to correct the x-coordinate value; the y-coordinate correction value $\Delta y$ is used to correct the y-coordinate value; and, the z-coordinate correction value $\Delta z$ is used to correct the z-coordinate value.

The corrected coordinate value x' (one example of the first coordinate value) is obtainable by Equation (7) below, which is for adding the x-coordinate correction value $\Delta x$ to the x-coordinate value.

$$x' = x + \Delta x \quad (7)$$

The corrected coordinate value y' (one example of the second coordinate value) is obtainable by Equation (8) below, which is for adding the y-coordinate correction value $\Delta y$ to the y-coordinate value.

$$y' = y + \Delta y \quad (8)$$

The corrected coordinate value z' (one example of the third coordinate value) is obtainable by Equation (9) below, which is for adding the z-coordinate correction value Δz to the z-coordinate value.

$$z' = z + \Delta z \quad (9)$$

At step S304, coefficient conversion is performed in a way which follows. The coefficient converter unit 128 reads from the storage device 144 the corrected z-coordinate value z' (third coordinate value) and use this value to correct the coefficients of Equations (1) and (2). Of the coefficients of Equations (1) and (2), specific coefficients $a_0$-$a_2$ and $b_0$-$b_2$ of first-degree and less degree terms therein are calculated, which are indicated by Equation (3) that is under the influence of the z value. More specifically, when obtaining these coefficients $a_0$-$a_2$ and $b_0$-$b_2$ in Equation (3), substitute thereinto the corrected z-coordinate value z' in place of the z value. By doing this, it is possible to obtain the intended coefficients $a_0$-$a_2$ and $b_0$-$b_2$ with a variation of the atmospheric pressure P being taken into consideration.

At step S306, beam deflection voltage computing is performed in a way which follows. The deflection voltage computing unit 146 uses the amended version of coordinate values obtained at the previous step to determine through computation an optimal deflection voltage of the electron beam 200.

Then at step S308, pattern writing is performed in a way which follows. The electron beam 200 which was emitted from the electron gun 201 that is one example of the irradiator unit as claimed is deflected by the main deflector 214 that is one example of the deflector unit in such a way as to irradiate the electron beam 200 that was deflected using the obtained deflection voltage to thereby draw a desired circuit pattern on the workpiece 101. In other words, an operation is performed for correcting the x-coordinate value and y-coordinate value based on the atmospheric air pressure by causing the main deflector 214 to apply electrostatic deflection to the electron beam 200. Additionally, by changing magnetic excitation to the objective lens 207 based on the corrected z-coordinate value z' to thereby correct the beam's focus position, it is also possible to perform correction of the z-coordinate value based on the atmospheric pressure.

Then at step S310, settling is performed in a way which follows. After completion of pattern writing per prespecified drawing unit region, data is set to DAC of deflector; here, a time period (called the settling time) is provided for waiting for potential stabilization of its output. An example is that in case an attempt is made to change the main deflector 214's deflection position to the next sub-field (SF) after completion of pattern writing of one SF, the system routine goes into a wait state for the settling time after having set the data in DAC 182 for the main deflection use. This settling time may be about 20 microseconds (us) in this embodiment.

On the other hand, in an atmospheric pressure correction task as internally executed by the deflection control circuit 140 that was commanded from CPU 120 in the pattern writing control circuit 110, the following processing is executed.

At step S202, corrected value verifying is performed in such a way that the corrected value verify unit 147 in deflection control circuit 140 is operatively responsive to receipt of a command from CPU 120 in pattern writing control circuit 110 for verifying whether the atmospheric pressure variation-based coordinate correction values Δx, Δy and Δz are changed or not at the time the pattern writing task is in the settling time period. To determine whether such value change is present or absent, an attempt may be made to obtain information from CPU 120 in pattern writing control circuit 110.

At step S204, updating is performed. To do this, the update unit 148 in deflection control circuit 140 operates in such a way that when a result of the above-stated verifying process indicates the presence of a value change(s), it reads the coordinate correction values Δx, Δy and Δz from the storage device 130 in the deflection control circuit 140 and performs updating by overwriting the read values on the previously obtained data being stored in the storage device 144 in deflection control circuit 140. By inputting the data only when value change(s) is/are found, it is possible to lessen the workload for data transfer.

As apparent from the foregoing description, regarding first the task to be executed by the CPU 142 in deflection control circuit 140, the intended data update is achievable on a real-time basis by receiving one-minute interval access from the execution process of CPU 120 in pattern writing control circuit 110, which becomes the atmospheric pressure correction process. Here, it is considered that the updating from the atmospheric pressure correction process can experience confliction or "batting" with a beam adjustment process and/or a pattern writing process being presently executed in the deflection control circuit 140. In light of this risk, this embodiment employs the so-called "dual task" configuration, which permits the task being executed in the deflection control circuit 140 to be of two parts. Doing so makes it possible to avoid the process batting. More precisely, with a one task scheme, a problem occurs as to a must to perform a troublesome and time-consuming procedure for receiving a command from the pattern writing process, for pausing the inherent pattern write task in order to provide access to the atmospheric pressure correction process during pattern writing, and for forcing a task for the atmospheric pressure correction use to get started. On the contrary, using the dual-task scheme makes it possible to permit startup of the atmospheric pressure correcting task in a parallel way without having to pausing the pattern writing task.

Also note that in the pattern writing task, a session for writing strip regions high in shot density can sometimes exceed one minute. The atmospheric pressure correction process is such that access is given to inside of the deflection control circuit 140 in any events at a preset length of time intervals (e.g., one-minute intervals) as stated previously. It is a must for the deflection control circuit 140 to monitor or "watchdog" asynchronous access from this atmospheric pressure correction process, so it takes a certain length of time for completion of this processing. In view of this, by performing calling of the atmospheric pressure-use task in a mid course of the pattern writing task, it is possible to complete the data update within the settling time period; for example, one minute-interval real-time correction is enabled. Additionally, in the pattern write processing task, the settling of the main deflection DAC amplifier having DAC 182 and amp 184 takes 20 μs, or more or less. Accordingly, by temporarily switching to the atmospheric pressure correction task at an idle time of the core during the settling time, it becomes possible to achieve real-time communications with the atmospheric pressure correction task.

At decision step S312, the CPU 142 of deflection control circuit 140 determines whether the pattern writing is completed or not. If it is completed, then quit the pattern writing task; otherwise, return to step S301.

Then, in the pattern writing task, the real-time corrected coordinate correction values Δx, Δy, Δz are used to compute coordinate values x', y' and z' at step S302. Then, use z'0 to convert the coefficients at step S304. Next at step S306, use the converted coefficients along with the corrected coordinate values x' and y' to compute DAC value data serving as the original of the next deflection voltage. Practically, at the deflection voltage computing step, respective coefficients $a_0$-$a_2$ and $b_0$-$b_2$ which have been computed by Equation (3) with its coefficients having been calculated using the z' value are substituted as variables the corrected x' and y' values into Equations (1) and (2) that are deflection sensitivity correction functions (x-y function formulas), thereby to obtain X value and Y value which become DAC value data. Then, use these X and Y values to compute DAC value (deflection voltage) used for each electrode of the deflector 214. Then at step S308, proper pattern writing is performed with the use of a value that is a DA-converted and amplified version of the DAC value that was corrected relative to a change in atmospheric air pressure.

It has been stated that the focussing correction and the correction of a beam position with the atmospheric pressure variation-caused coordinate position errors ($\Delta x$, $\Delta y$, $\Delta z$) being involved therein are performed by a process having the steps of obtaining respective coefficients $a_0$-$a_2$ and $b_0$-$b_2$ of the deflection sensitivity correction functions for calculation of the optimum deflection voltage and inputting the corrected values x' and y' and then obtaining DAC value data on a real-time basis and finally performing pattern writing processing while performing correction using these values, thereby making it possible to form a pattern on the workpiece 101 at a pattern writing position therein while at the same time increasing or maximizing the accuracy thereof.

Figure 11:
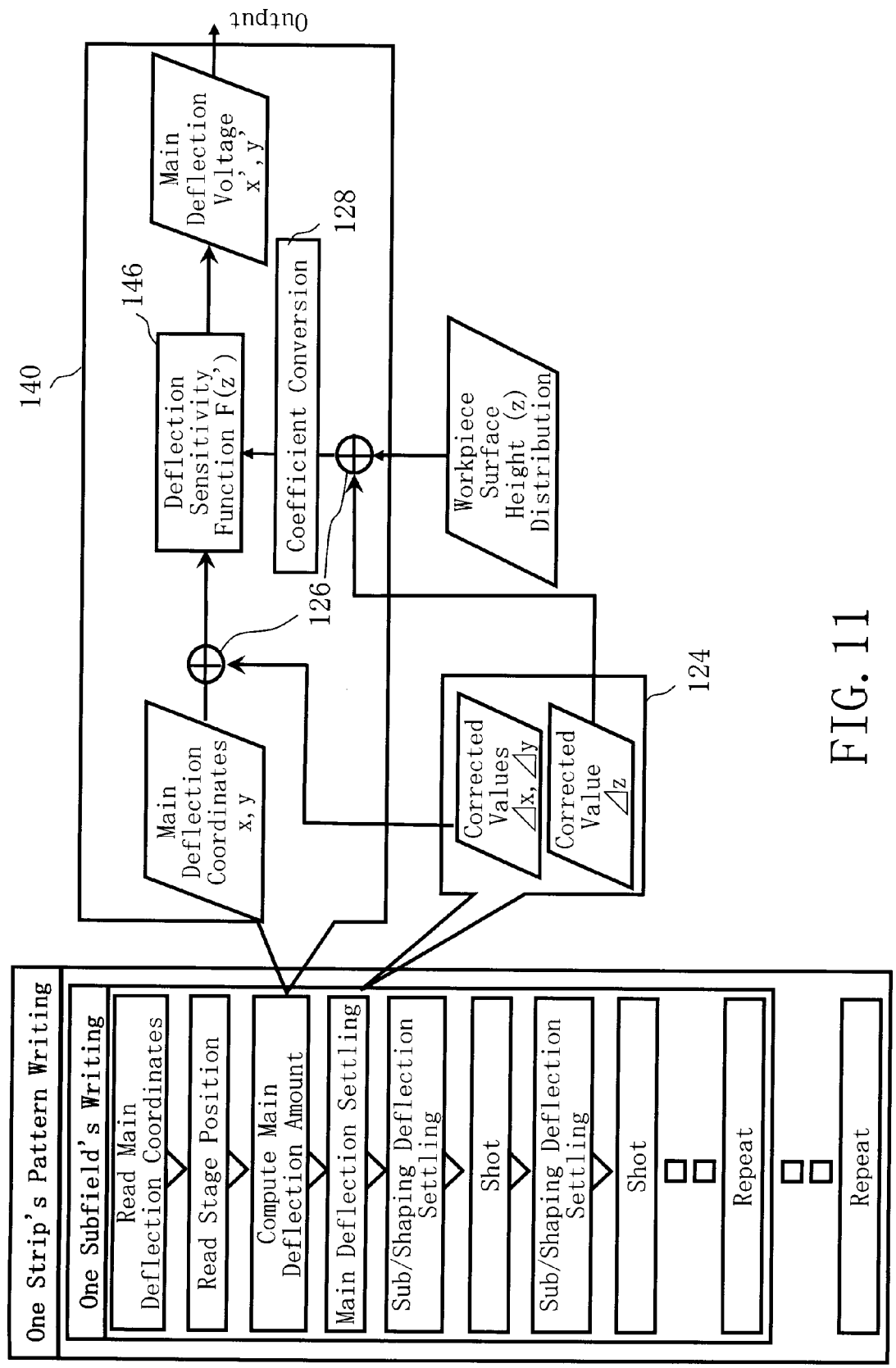
FIG. 11 is a diagram showing an exemplary pattern writing operation flow along with the timing of air pressure correction operation.

FIG. 11 is a diagram showing an exemplary pattern writing operation flow along with the timing of an air pressure correction operation.

In FIG. 11, there are shown a pattern writing operation in a one strip and one sub-field and an atmospheric pressure correction operation in sync with the former operation. The one-strip writing operation is performed by repeated execution of any given number of subfield writing operations. The one-subfield write operation starts with reading of the main deflection coordinate value(s), followed by main deflection amount calculation and repeated execution of a given number of shots. The deflection control circuit 140 performs main deflection amount computation by substituting the read main deflection coordinate value (x,y) into the deflection sensitivity functions (i.e., Equations (1) and (2)) in the deflection voltage computing unit 146. In the case of the atmospheric pressure correction being executed, in this process, the coordinate value correction unit 126 adds thereto a corrected amount calculated by the coordinate correction value computing unit 124. Then, the coefficient converter unit 128 further uses the correction-completed z' value to perform coefficient conversion. The coordinate correction value computing unit 124 is operating in async with the pattern writing operation and the beam adjustment process, and calculates, at one-minute intervals as an example, those correction amounts $\Delta x$, $\Delta y$ and $\Delta z$ of 3D coordinate values of x, y and z, which will be passed to the deflection control circuit 140. This control circuit 140 performs readout of an atmospheric pressure correction amount from the coordinate correction value computing unit 124 within a wait time period other than its active time for computing the main deflection amount—here, within the main deflection settling time period in a subfield writing operation, by way of example. Thus it is possible to permit synchronization of the atmospheric pressure correction in units of subfield writing operations. In addition, owing to this operation principle, it becomes possible to achieve the atmospheric pressure correction on a real-time basis. In this way, the addition control is performed in a way that it operates independently of the pattern writing process and the beam adjustment process while causing the coordinate correction values $\Delta x$, $\Delta y$ and $\Delta z$ to be in sync with 3D coordinate values in any one of the pattern writing process and the beam adjustment process in units of subfield operations.

An explanation will here be given of a method for management of the pattern writing process and the beam adjustment process. The beam adjustment process is executed according to a preset processing menu in units of adjustment time periods. In this embodiment, an explanation will be given of a case where focussing or else is performed once per week. If a focussing error occurrable due to changes in outside air pressure is not corrected, the magnetic excitation current of an optimal focus point is variable depending on an atmospheric pressure. Consequently, in case the focussing is done at the time of a low pressure, a pattern is to be drawn in the state that a beam is out of focus in ordinary weather. Additionally, at a stage of beam calibration for correction of a deflection error of the beam, rotation of deflection and magnification errors can take place in accordance with an atmospheric air pressure. For this reason, the beam calibration performed in the state of atmospheric depression would result in unwanted execution of pattern writing with deviation of deflection sensitivity in ordinary weather, which poses a problem as to an accidental increase in batting errors.

In view of this risk, this embodiment is arranged to correct atmospheric pressure variation-dependent errors in 3D beam positions in x-, y- and z-axis directions, thereby enabling the beam's focus point to stay constant in any events while at the same time making it possible to suppress fluctuations of beam deflection errors. Thus it becomes possible to achieve high-accuracy pattern writing while preventing beam focussing offsets and deflection sensitivity errors from increasing depending on the timing of a change in atmospheric pressure.

Embodiment 2

In Embodiment 1, the case has been described where a distribution of height values of a workpiece surface is measured in advance as a z-axis position map or "z-map." In this case, an atmospheric pressure change-dependent variation component $\Delta z$ is added to the premeasured z-map data to obtain a newly calculated z' value, which is used to write a pattern after correction, as stated previously. This is done because the z-axis sensor's measurement value indicative of the height (z) of workpiece surface deviates unintentionally depending upon a change in atmospheric air pressure. However, this z-sensor may also be reduced to a commercial product with a structure being lessened in variability of the atmospheric pressure. Embodiment 2 is arranged to employ such z-sensor with enhanced robustness against atmospheric pressure variations. Its other structures and configurations are similar to those of Embodiment 1. In the case of using such z-sensor with enhanced robustness against atmospheric pressure variations, it is preferable to employ a system design which performs z-axis position correction during pattern writing on a real-time basis, rather than the z-map scheme. More specifically, read the height (z) data out of the z sensor on a per-subfield basis. Then, calculate Equation (3) to obtain the coefficients of Equations (1) and (2). By inputting atmospheric pressure change-dependent variable position error-corrected position information (x', y') to the deflection sensitivity correction functions of Equations (1) and (2) to thereby perform pattern writing, similar results are obtainable.

Embodiment 3

In Embodiments 1 and 2, the main deflector 214 that is an electrostatic deflector was used to correct the beam's position by means of electrostatic deflection. In other words, the main deflector 214 electrostatically deflect the electron beam 200 to thereby perform correction of the x-coordinate value and y-coordinate value based on an outside air pressure while at the same time causing the objective lens 207 to perform correction of the z-coordinate value based on the atmospheric pressure. However, the beam correction should not exclusively be limited to this approach. In Embodiment 3, a case will be explained where another configuration is used to correct the beam's deflection position and focussing position.

Figure 12:
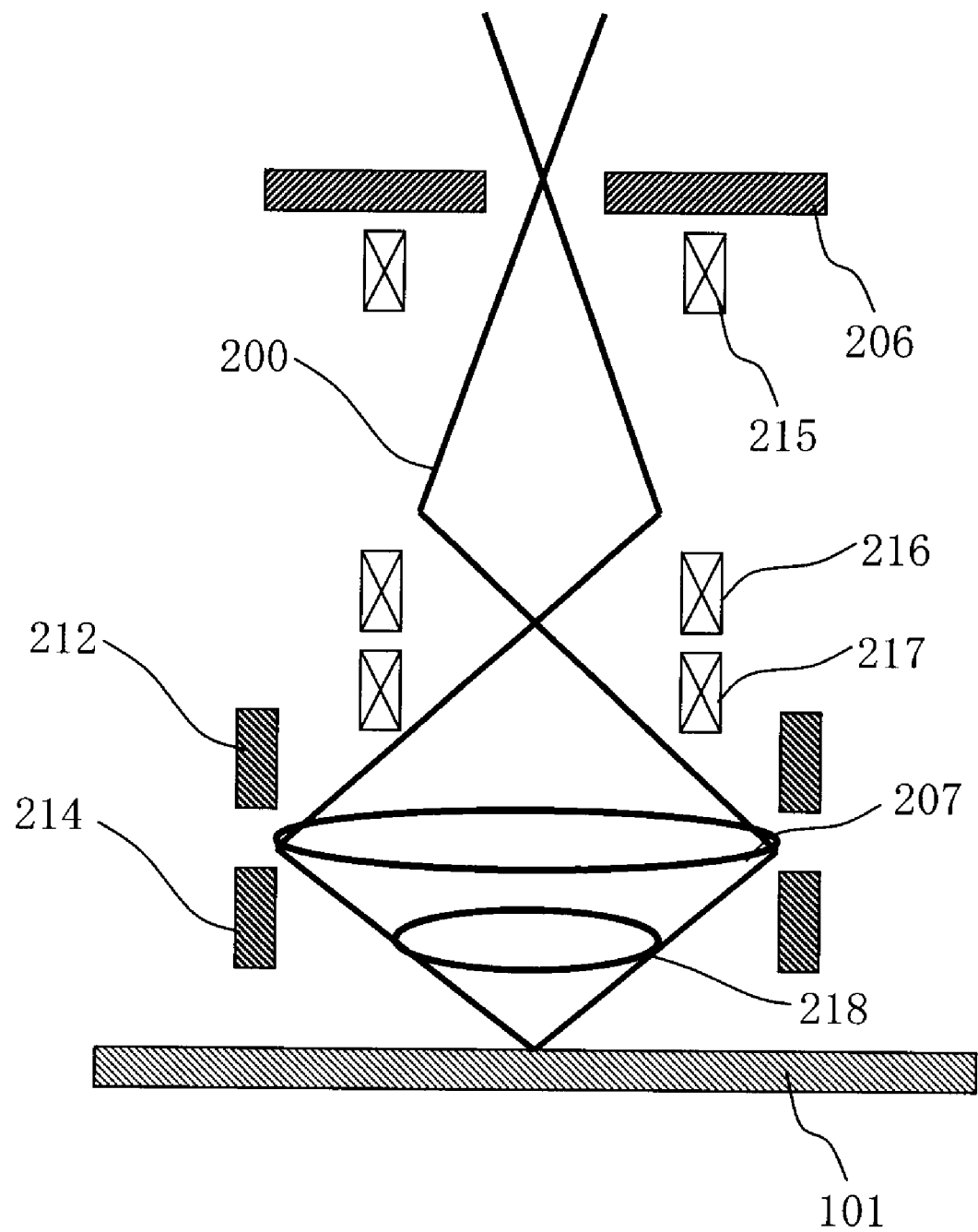
FIG. 12 illustrates, in cross-section, a structure of main part of a pattern writing apparatus also embodying the invention.
Figure 13:
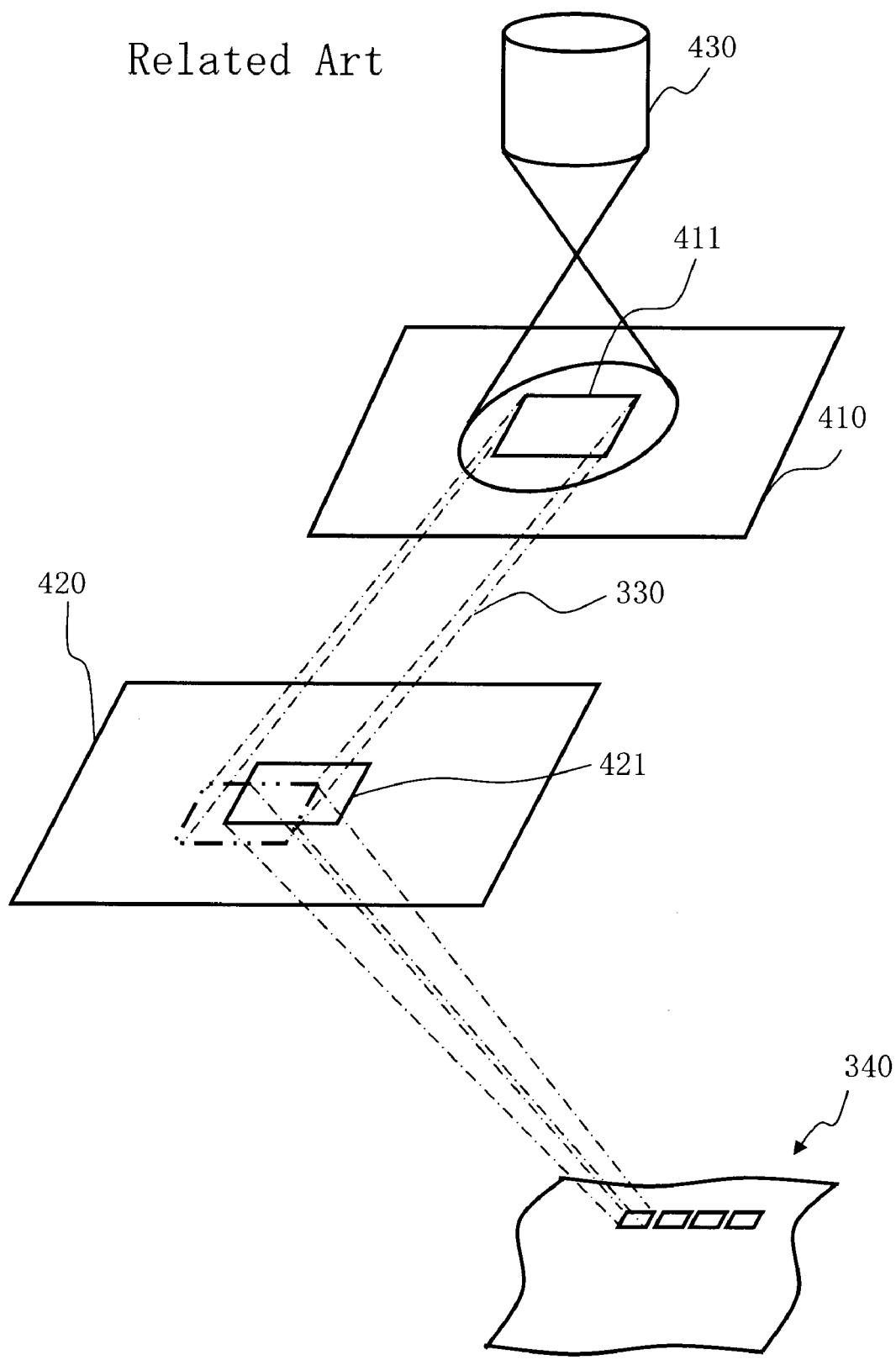
FIG. 13 depicts schematically a perspective view of an electron beam optics in prior known variable-shaped electron beam lithographic apparatus.

FIG. 12 illustrates, in cross-section, a structure of main part of a pattern writing apparatus also embodying the invention.

An electron beam optics shown in FIG. 12 is similar to that shown in FIG. 1 with alignment coils 215, 216 and 217 and an electrostatic lens 218 being added to the former. Its other arrangements also are similar to those of Embodiment 1, except for those points to be described below. At the alignment coils 215-217 which are situated over the objective lens 207, beam deflection is performed by use of a magnetic field(s) as derived by an excitation current(s). The beam position may be corrected by using these coils. In other words, it is also preferable to perform correction of the x-coordinate value and y-coordinate value based on an outside air pressure by causing at least one of the alignment coils 215-217, in place of the main deflector 214, to electrostatically deflect the electron beam 200.

Regarding the correction of z-coordinate value based on an atmospheric pressure, it is also permissible to use either the main deflector 214 or the independently disposed electrostatic lens 218 (second electrostatic deflector) in place of the objective lens for correction. For example, the beam focussing is corrected by additionally applying a constant potential level of voltage to the main deflector 214, whereby it is possible to perform the correction of the z-coordinate value based on the atmospheric pressure. Similarly, by correcting the beam focussing position by applying for superposition a constant voltage to the electrostatic deflector 218, it is possible to perform the correction of the z-coordinate value based on the atmospheric pressure.

It should be noted that in the description above, the processing contents or operation contents of those recited as "... units" or "... steps" are arrangeable by software programs which are executable by electronic arithmetic processing apparatus, such as digital computers or else. Alternatively, these processing/operation contents may be implemented not only by software programs but also by any possible combinations of hardware and software configurations. Still alternatively, similar results are obtainable by arrangement combined with firmware configurations. In the case of a software program being used for the intended arrangement, this program is typically installed and stored in an adequate recording media, such as a magnetic disk device, magnetic tape device, floppy diskettes (FDs), read-only memory (ROM), or nonvolatile programmable memory—e.g., "Flash" memory. Regarding the embodiments as disclosed herein, the program is stored in the storage device 130 or 144.

Also note that in the embodiment shown in FIG. 1, the CPU 120 and/or CPU 142 for use as computer equipment may be connected via an internal data transmission bas(es) to a random access memory (RAM) for use as the storage device, ROM, large-capacity hard disk drive (HDD), data entry device such as a keyboard with or without a pointing device called the "mouse," data output device such as a monitor display or printer, input/output interface (IO-I/F) equipment, and external storage device such as an FDD, a digital versatile disk (DVD) drive, a compact disc (CD) device, etc.

While the invention has been described with reference to specific embodiments, the description is illustrative of the invention and is not to be construed as limiting the invention.

Although the description excludes explanations as to those parts or components which are deemed unnecessary for explanation of this invention such as apparatus arrangements and control schemes, such components are employable through appropriate choices on a case-by-case basis. For example, the configuration of the control unit for control of the pattern writing apparatus 100 may be designed to include necessary components other than those discussed and illustrated herein.

Any other possible charged-particle beam lithographic methods and apparatuses comprising the subject matter of this invention and being design-changeable by a technician in the semiconductor lithography art with software programs for use therein are all interpreted to be included in the scope and coverage of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam pattern writing apparatus comprising:
   an air pressure measuring unit operative to measure a value of an outside air pressure;
   a coordinate value correcting unit operative to correct a set of three-dimensional ("3D") coordinate values by use of the value of the outside air pressure measured;
   a deflection amount computing unit operative to calculate a deflection amount of a charged particle beam by using the 3D coordinate values corrected;
   an irradiator unit for irradiation of the charged particle beam; and
   a deflector unit for deflection of the charged particle beam based on the deflection amount.

2. The apparatus according to claim 1, further comprising:
   a coordinate correction value calculation unit operative to calculate an x-coordinate correction value for correction of an x-coordinate value indicative of a position along a first direction in parallel with a pattern writing surface of a workpiece, a y-coordinate correction value for correction of a y-coordinate value indicative of a position in a second direction extending in parallel to the pattern writing surface and being at right angles to the first direction, and a z-coordinate correction value for correction of a z-coordinate value indicative of a position in a third direction perpendicular to the pattern writing surface, wherein
   said 3D coordinate values are defined by the x-coordinate value, the y-coordinate value and the z-coordinate value, and
   said coordinate value correction unit corrects the x-coordinate value by use of the x-coordinate correction value, corrects the y-coordinate value by using the y-coordinate correction value, and corrects the z-coordinate value by using the z-coordinate correction value.

3. The apparatus according to claim 2, further comprising:
   a coefficient conversion unit operative to use the z-coordinate value thus corrected to convert more than one coefficient of a prespecified formula for calculation of the deflection amount of the charged particle beam with x and y being as variables thereof, wherein
said deflection amount computing unit substitutes as the variables the corrected x-coordinate value and the corrected y-coordinate value into a prespecified x-y function formula with its coefficients converted.

4. The apparatus according to claim 3, wherein said deflector unit includes at least one of an electrostatic deflector for applying electrostatic deflection to the charged particle beam to thereby perform correction of the x-coordinate value and the y-coordinate value based on the outside air pressure and an alignment coil for applying electromagnetic deflection to the charged particle beam to thereby perform correction of the x-coordinate value and the y-coordinate value based on the outside air pressure.

5. The apparatus according to claim 3, wherein said deflector unit includes an electrostatic deflector for applying electrostatic deflection to the charged particle beam to thereby perform correction of the x-coordinate value and the y-coordinate value based on the outside air pressure while performing correction of the z-coordinate value based on the outside air pressure by correcting a focus position through superposition of a constant voltage.

6. The apparatus according to claim 3, further comprising:
an objective lens for adjustment of a focus position of the charged particle beam and for performing correction of the z-coordinate value based on the outside air pressure by varying magnetic excitation.

7. The apparatus according to claim 5, further comprising:
another electrostatic deflector for correcting the focus position by superposition of a constant voltage to thereby perform correction of the z-coordinate value based on the outside air pressure.

8. The apparatus according to claim 2, wherein said coordinate value correcting unit operates independently of a pattern writing process and a beam adjustment process and performs addition control while letting the x-coordinate correction value and the y-coordinate correction value plus the z-coordinate correction value be in sync with 3D coordinate values in any one of the pattern writing process and the beam adjustment process in units of sub-field operations.

9. The apparatus according to claim 8, wherein two stages of main and subsidiary deflection amounts are computed in said charged particle beam pattern writing apparatus, and wherein said coordinate value correcting unit externally inputs the x-coordinate correction value and the y-coordinate correction value and the z-coordinate correction value within a wait time period other than a time period for computing the main deflection amount.

10. The apparatus according to claim 3, further comprising:
a sensor for measurement of the z-coordinate value of the pattern writing surface of the workpiece; and
a reference mark for use in calibration of said sensor, wherein
said deflection amount of the charged particle beam is computed based on an addition value of the z-coordinate correction value obtained based on the outside air pressure added plus a z-coordinate value measured during pattern writing by use of said sensor calibrated by said reference mark prior to pattern writing.

11. A charged particle beam writing method comprising:
measuring a value of an atmospheric air pressure;
correcting 3D coordinate values by use of the atmospheric air pressure value measured;
computing a deflection amount of a charged particle beam by using the 3D coordinate values corrected; and
irradiating the charged particle beam as deflected based on the deflection amount to thereby write a desired pattern on a workpiece.

12. The method according to claim 11, further comprising:
calculating an x-coordinate correction value for correction of an x-coordinate value indicative of a position in a first direction extending in parallel to a pattern writing surface of the workpiece, a y-coordinate correction value for correction of a y-coordinate value indicative of a position in a second direction being in parallel to the pattern writing surface and being at right angles to the first direction, and a z-coordinate correction value for correction of a z-coordinate value indicative of a position in a third direction perpendicular to the pattern writing surface,
defining the 3D coordinate values by the x-coordinate value, the y-coordinate value and the z-coordinate value; and
upon correction of said 3D coordinate values, correcting the x-coordinate value by use of the x-coordinate correction value, correcting the y-coordinate value by use of the y-coordinate correction value, and correcting the z-coordinate value by using the z-coordinate correction value.

13. The method according to claim 12, further comprising:
using the z-coordinate value corrected to convert one or more coefficients of a prespecified formula with x and y being as variables thereof for use in computation of the deflection amount of said charged particle beam; and
upon computation of said deflection amount, substituting as the variables the corrected x-coordinate value and the corrected y-coordinate value into the prespecified x-y function formula with the coefficients converted.

14. A computer-readable recording medium storing therein a software program for causing a logic operation device to perform a procedure comprising the steps of:
reading, from a storage device storing therein a first coordinate correction value and a second coordinate correction value plus a third coordinate correction value for correction of first, second and third coordinate values based on a value of an atmospheric air pressure, the first, second and third coordinate correction values to thereby use the first, second and third coordinate correction values thus read to correct the first to third coordinate values for storage in the storage device;
reading from said storage device the third coordinate value for using this value to perform conversion of one or more coefficients of a prespecified formula for calculation of a deflection amount of a charged particle beam; and
using the first and second coordinate values and the coefficients of said prespecified formula to determine the deflection amount of the charged particle beam and then outputting a result thereof.

* * * * *